(12) United States Patent
Kim et al.

(10) Patent No.: US 8,999,524 B2
(45) Date of Patent: Apr. 7, 2015

(54) ORGANIC LIGHT-EMITTING DEVICE

(75) Inventors: Dong-Heon Kim, Yongin (KR); Tae-Shick Kim, Yongin (KR); Kwan-Hee Lee, Yongin (KR); Min-Seung Chun, Yongin (KR); Jung-Ha Son, Yongin (KR); Jae-Hyun Kwak, Yongin (KR); Mi-Kyung Kim, Yongin (KR); Choon-Woo Lim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 146 days.

(21) Appl. No.: 13/097,437

(22) Filed: Apr. 29, 2011

(65) Prior Publication Data

US 2011/0266531 A1 Nov. 3, 2011

(30) Foreign Application Priority Data

Apr. 30, 2010 (KR) .................. 10-2010-0040796

(51) Int. Cl.
*H01L 51/50* (2006.01)
*H01L 51/00* (2006.01)

(52) U.S. Cl.
CPC .......... *H01L 51/0067* (2013.01); *H01L 51/005* (2013.01); *H01L 51/0059* (2013.01); *H01L 51/0072* (2013.01); *H01L 51/0077* (2013.01); *H01L 51/006* (2013.01); *H01L 51/50* (2013.01); *H01L 51/5048* (2013.01); *Y10S 428/917* (2013.01)

(58) Field of Classification Search
USPC .................. 428/690, 917; 313/504, 505, 506; 257/40, E51.05, E51.026, E51.032; 244/234; 246/18; 564/26, 426, 434
See application file for complete search history.

(56) References Cited

U.S. PATENT DOCUMENTS

| | | | |
|---|---|---|---|
| 2003/0137239 A1* | 7/2003 | Matsuura et al. | 313/503 |
| 2005/0074628 A1 | 4/2005 | Yoon et al. | |
| 2006/0057427 A1 | 3/2006 | Tsukahara et al. | |
| 2006/0076885 A1 | 4/2006 | Kim et al. | |
| 2008/0107919 A1 | 5/2008 | Hwang et al. | |
| 2008/0111476 A1 | 5/2008 | Choi et al. | |
| 2008/0213620 A1 | 9/2008 | Kim et al. | |
| 2008/0220285 A1* | 9/2008 | Vestweber et al. | 428/690 |

(Continued)

FOREIGN PATENT DOCUMENTS

| | | |
|---|---|---|
| JP | 2004277368 | 10/2004 |
| JP | 2005119994 | 5/2005 |

(Continued)

OTHER PUBLICATIONS

Let et al., Synthesis of Multiaryl-Substituted Pyrindine Derivatives and Applications in Non-Doped Deep Blue OLEDs as Electron Transporting Layer with High Hole-Blocking Ability, Advanced Materials, vol. 22, pp. 527-530.*

(Continued)

*Primary Examiner* — Gregory Clark
(74) *Attorney, Agent, or Firm* — Robert E. Bushnell, Esq.

(57) ABSTRACT

An organic light-emitting device includes a first electrode, a mixed organic layer, an emission layer, an electron transport layer, and a second electrode. The mixed organic layer contains a fluorene derivative and a pyrazine derivative, and the electron transport layer contains a lithium quinolate and a pyridine derivative.

19 Claims, 4 Drawing Sheets

(56) References Cited

U.S. PATENT DOCUMENTS

| | | | |
|---|---|---|---|
| 2008/0238300 A1* | 10/2008 | Park et al. | 313/504 |
| 2008/0258615 A1* | 10/2008 | Begley et al. | 313/504 |
| 2009/0153040 A1 | 6/2009 | Kim et al. | |
| 2009/0165860 A1 | 7/2009 | Kim et al. | |
| 2009/0189519 A1 | 7/2009 | Lee et al. | |
| 2009/0189521 A1 | 7/2009 | Chun et al. | |
| 2009/0236980 A1* | 9/2009 | Ohsawa | 313/504 |
| 2009/0309491 A1 | 12/2009 | Kwon et al. | |
| 2010/0277063 A1 | 11/2010 | Ito et al. | |
| 2011/0140089 A1 | 6/2011 | Terao | |

FOREIGN PATENT DOCUMENTS

| | | |
|---|---|---|
| JP | 2005239650 | 9/2005 |
| JP | 2006-279014 | 10/2006 |
| JP | 2007137795 | 6/2007 |
| JP | 2007142011 | 6/2007 |
| JP | 2009-094124 | 4/2009 |
| JP | 2009-277791 | 11/2009 |
| JP | 2010-034548 | 2/2010 |
| JP | 2010-050281 | 3/2010 |
| KR | 1999-0044817 | 6/1996 |
| KR | 1020000051315 A | 8/2000 |
| KR | 1020000067671 A | 11/2000 |
| KR | 10-2005-0097670 | 10/2005 |
| KR | 1020060032099 | 4/2006 |
| KR | 1020070016418 A | 2/2007 |
| KR | 1020070028284 | 3/2007 |
| KR | 1020070063853 A | 6/2007 |
| KR | 1020070078698 | 8/2007 |
| KR | 1020080042650 | 5/2008 |
| KR | 100846597 | 7/2008 |
| KR | 1020090082778 | 7/2009 |
| WO | 2007086701 A1 | 8/2007 |

OTHER PUBLICATIONS

Japanese Office Action issued on Jan. 6, 2015 of the Japanese Patent Application No. 2011-099568, which corresponds to the subject U.S. Patent Application.

* cited by examiner

ORGANIC LIGHT-EMITTING DEVICE

RELATED APPLICATIONS

This application claims the benefit of Korean Patent Application No. 10-2010-0040796, filed on Apr. 30, 2010, in the Korean Intellectual Property Office, the disclosures of which are incorporated herein in their entirety by reference.

BACKGROUND

1. Field

One or more embodiments of the present invention relate to an organic light-emitting device. In particular, one or more embodiments of the present invention relate to an organic light-emitting device with high emission efficiency including a mixed organic layer and an electron transport layer.

2. Description of the Related Art

Organic light-emitting devices generate light by a recombination of electrons and holes in an organic layer interposed between electrodes when a current is applied to the organic layer. Accordingly, organic light-emitting devices enable a lightweight, thin information display device to be embodied, which has a short response speed and a wide viewing angle while producing a high quality image. Due to these advantages, techniques for organic light-emitting devices have rapidly developed, and organic light-emitting devices are used in a wide range of applications from mobile phones to high-quality information display devices. In order to develop an organic light-emitting device in terms of yield and quality, emission efficiency and lifetime need to be increased while lowering power consumption.

As for doping a hole transport layer of an organic light-emitting device, according to a conventional technique, a hole injection layer and/or hole transport layer is doped with tetrafluoro tetracyano quinodimethane (F4TCNQ) or the like to reduce power consumption. However, the molecular weight of the compound is too low and thus, chamber contamination may occur during a deposition process and an emission efficiency of an emission layer may be degraded.

In order to prevent expression of dark spots or pixel shorts due to foreign substances remaining on the surface of a substrate during the manufacture process of an organic light-emitting device, the thickness of a hole transport layer needs to be 500 Å or more. In this case, however, holes may not be smoothly transported to an emission layer and thus, an operating voltage of an organic light-emitting device is increased and the efficiency and lifetime of the organic light-emitting device is lowered. Accordingly, there is a need to decrease an operating voltage which directly affects power consumption when an organic light-emitting device is manufactured.

Conventionally, an electron transport layer is formed by doping an organic material with an alkali metal such as lithium or cesium. However, an electron transport layer formed as described above may have low efficiency or a short lifetime.

SUMMARY

One or more embodiments of the present invention include an organic light-emitting device with high emission efficiency.

Additional aspects will be set forth in part in the description which follows and, in part, will be apparent from the description, or may be learned by practice of the presented embodiments.

According to one or more embodiments of the present invention, an organic light-emitting device includes a first electrode, a second electrode, an emission layer between the first electrode and the second electrode, a mixed organic layer between the emission layer and the first electrode and an electron transport layer between the emission layer and the second electrode, wherein the mixed organic layer includes a fluorene derivative and a pyrazine derivative, and the electron transport layer includes a lithium quinolate and a pyridine derivative.

According to one or more embodiments of the present invention, an organic light-emitting device includes a first electrode, second electrode, an emission layer between the first electrode and the second electrode, a mixed organic layer between the emission layer and the first electrode and an electron transport layer between the emission layer and the second electrode, wherein the mixed organic layer includes a fluorene derivative selected from compounds represented by Formulas 1 to 9 and a pyrazine derivative represented by Formula 16, and the electron transport layer includes a lithium quinolate and a pyridine derivative represented by Formula 32:

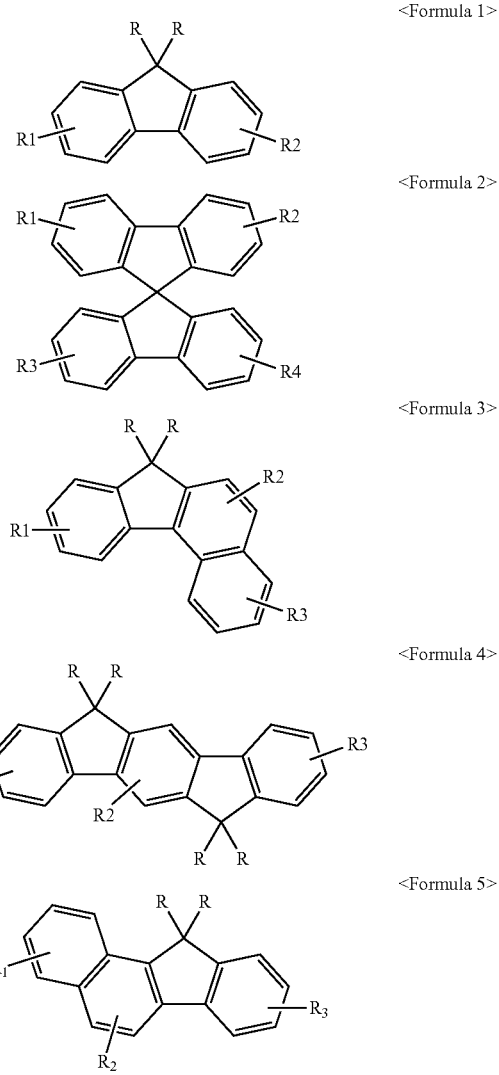

-continued

<Formula 6>
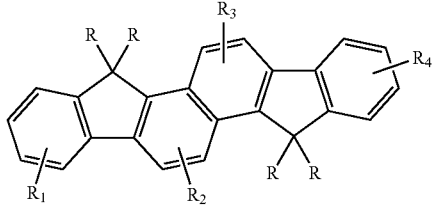

<Formula 7>
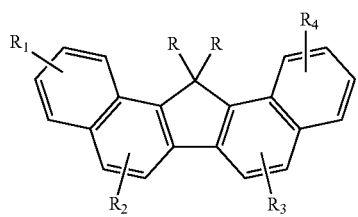

<Formula 8>
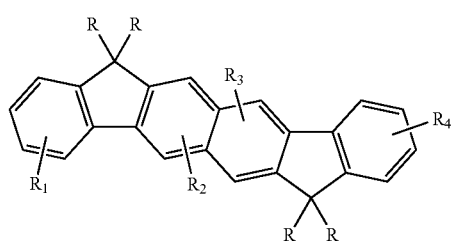

<Formula 9>
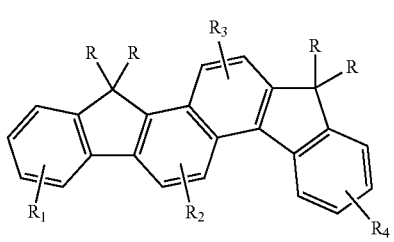

wherein R, $R_1$, $R_2$, $R_3$ and $R_4$ in Formulae 1 through 9 are, each independently, a hydrogen atom, a substituted or unsubstituted C1-30 alkyl group, a substituted or unsubstituted C1-30 alkenyl group, a substituted or unsubstituted C1-C30 alkoxy group, a substituted or unsubstituted C6-C30 aryl group, a substituted or unsubstituted C6-C30 aryloxy group, a substituted or unsubstituted C2-C30 heteroaryl, or a substituted or unsubstituted C5-C30 condensed polycyclic group, a hydroxyl group, a cyano group, or a substituted or unsubstituted amino group; and <Formula 16>
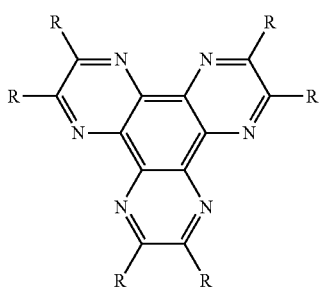

wherein each R in Formula 16 is independently a hydrogen atom, a C1-C10 alkyl group, an alkyloxy group, dialkyl amine, halogen, or cyano; and <Formula 32>
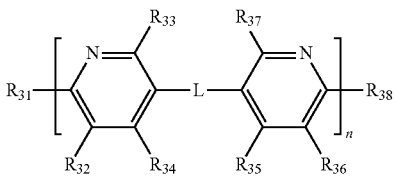

wherein L is a direct linkage or a bivalent linking group, and is selected from the group consisting of methylene, vinylene, phenylene, anthrylene, thienylene, fluorenylene, spirobifluorenylene, indenofluorenylene, pyridylene, carbazolylene, indenocarbazolylene, benzothiazolylene, oxadiazolylene, pyrylene, furylene, and the above-described groups substituted with one or more substituents selected from the group consisting of alkyl, alkoxy, alkenyl, alkynyl, alkylthio, alkylamino, arylamino, heteroarylamino, aryloxy, heteroaryloxy, arylthio, heteroarylthio, halogen, and cyano, $R_{31}$ to $R_{38}$ are, each independently, a group selected from group consisting of the following structures:

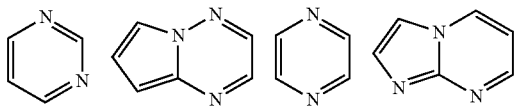

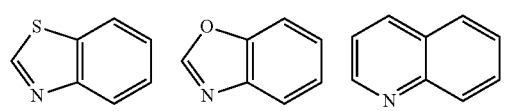

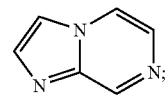

and n is an integer of 2 to 6.p

According to one or more embodiments of the present invention, an organic light-emitting device includes a first electrode, a second electrode, an emission layer between the first electrode and the second electrode, a hole-related layer including a hole injection layer between the first electrode and the emission layer, a hole transport layer between the hole injection layer and the emission layer, and a mixed organic layer positioned between the first electrode and the hole injection layer, between the hole transport layer and the emission layer, or inside the hole transport layer, the mixed organic layer including a fluorene derivative and a pyrazine derivative, the fluorene derivative selected from compounds represented by Formulas 1 to 9 and the pyrazine derivative represented by Formula 16, and the electron transport layer includes a lithium quinolate and a pyridine derivative represented by Formula 32.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
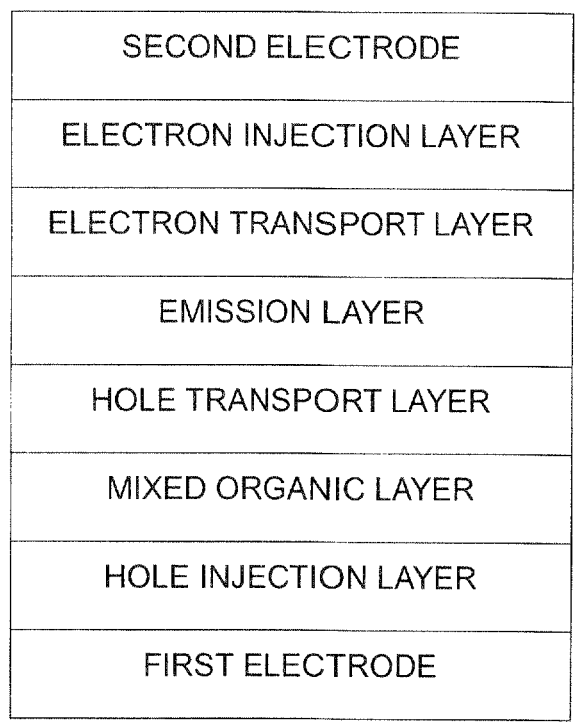
FIGS. 1-4 are schematic views of organic light-emitting devices according to embodiments of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

An organic light-emitting device according to an embodiment of the present invention includes a first electrode, a second electrode, a hole-related layer, an emission layer, and an electron transport layer, wherein the hole-related layer, the emission layer, and the electron transport layer are interposed between the first electrode and the second electrode. The hole-related layer includes a mixed organic layer in which a fluorene derivative is doped with a pyrazine derivative, and the electron transport layer includes a lithium quinolate and a pyridine derivative.

FIG. 1 is a schematic view of an organic light-emitting device according to an embodiment of the present invention. Referring to FIG. 1, a first electrode, a hole injection layer, a mixed organic layer, a hole transport layer, an emission layer, an electron transport layer, an electron injection layer, and a second electrode are sequentially formed on a substrate in the stated order.

Figure 2:
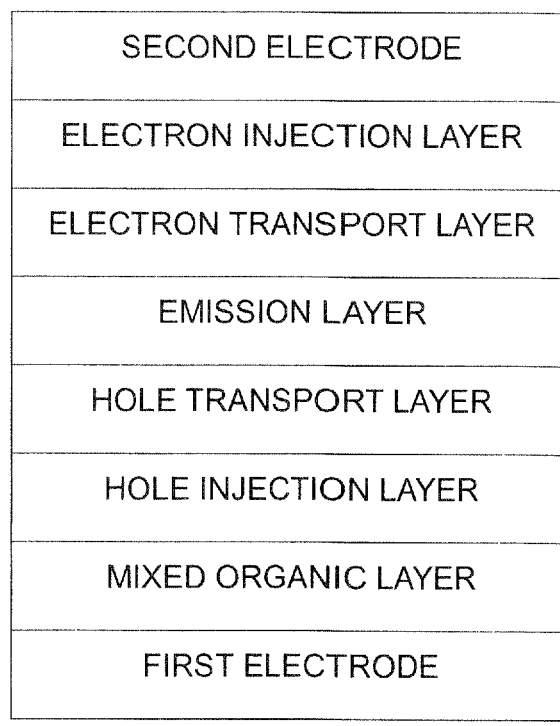
Figure 3:
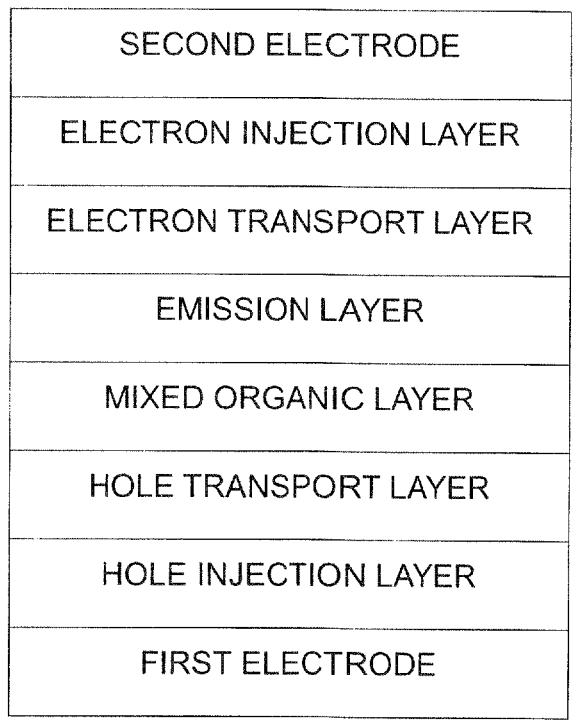
Figure 4:
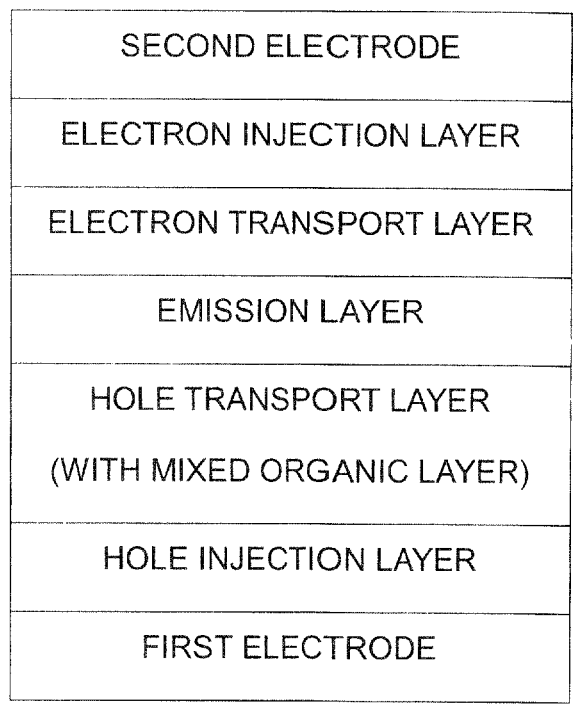

Although in FIG. 1, the mixed organic layer is interposed between the hole injection layer and the hole transport layer, the location of the mixed organic layer is not limited thereto, and for example, the mixed organic layer may be interposed between the first electrode and the hole injection layer (FIG. 2) or between the hole transport layer and the emission layer (FIG. 3), or formed inside the hole transport layer (FIG. 4). In addition, at least one of the hole injection layer and the hole transport layer may not be formed.

In the organic light-emitting device, the first electrode is formed by depositing or sputtering a first electrode-forming material having a high work function on the substrate. Examples of the first electrode material include indium tin oxide (ITO), indium zinc oxide (IZO), tin oxide ($SnO_2$), zinc oxide (ZnO), aluminum (Al), silver (Ag), and magnesium (Mg), which are materials that have excellent conductivity. The first electrode may be formed as a transparent or reflective electrode.

The hole-related layer including one or more mixed organic layers is formed on the first electrode.

The mixed organic layer is formed by doping a fluorene derivative, which acts as a host, with a pyrazine derivative. Since the organic light-emitting device includes the mixed organic layer, high emission efficiency may be obtained compared to a conventional organic light-emitting device that does not include a pyrazine derivative-doped layer.

The fluorene derivative may be represented by any one of Formulas 1 through 9:

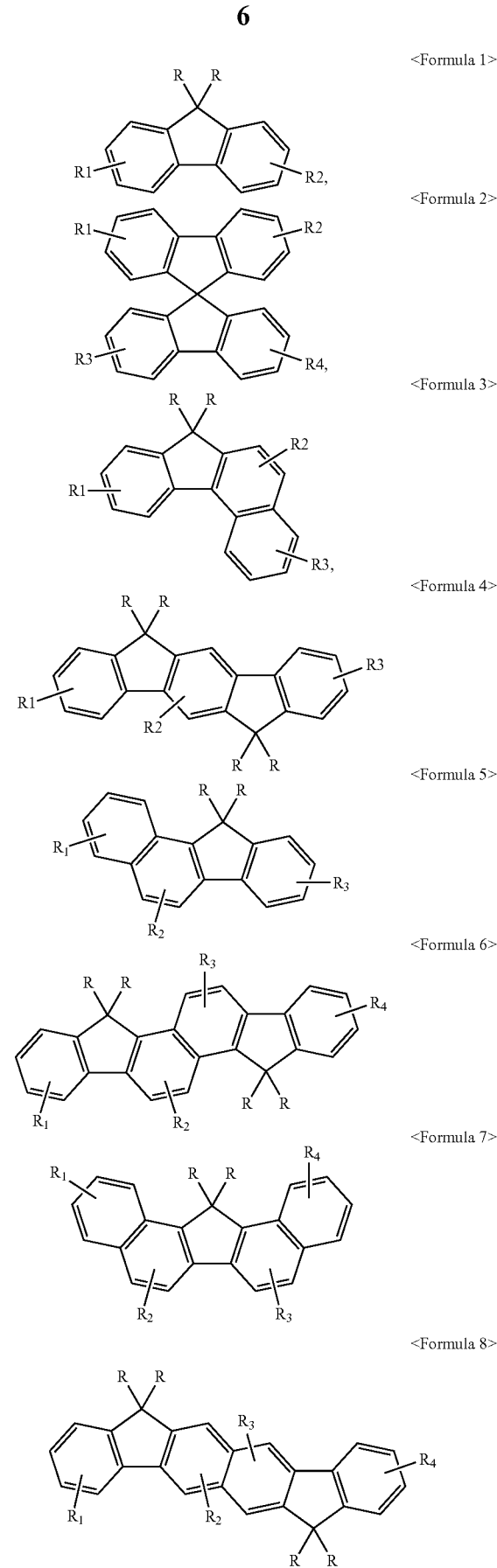

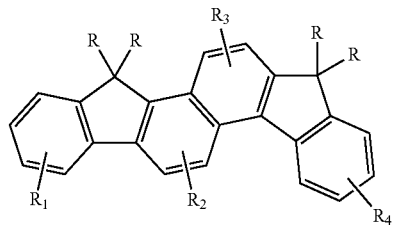

<Formula 9> wherein R, $R_1$, $R_2$, $R_3$, and $R_4$ are, each independently, a hydrogen atom, a substituted or unsubstituted C1-30 alkyl group, a substituted or unsubstituted C1-30 alkenyl group, a substituted or unsubstituted C1-C30 alkoxy group, a substituted or unsubstituted C6-C30 aryl group, a substituted or unsubstituted C6-C30 aryloxy group, a substituted or unsubstituted C2-C30 heteroaryl, a substituted or unsubstituted C5-C30 condensed polycyclic group, a hydroxyl group, a cyano group, or a substituted or unsubstituted amino group.

For example, the fluorene derivative represented by any one of Formulas 1 through 9 may be any one of Compounds 1 through 6 represented by Formulae 10 through 15, respectively, but are not limited thereto:

<Compound 1>

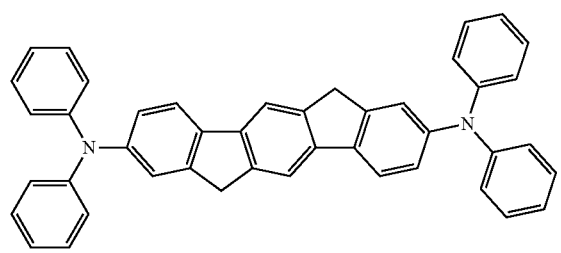

<Formula 10>

<Compound 2>

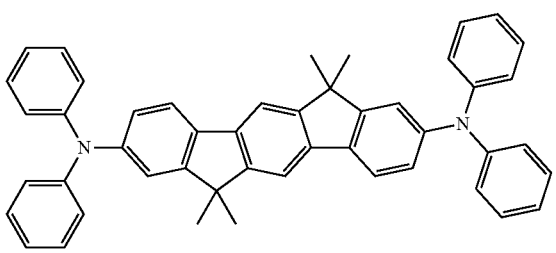

<Formula 11>

<Compound 3>

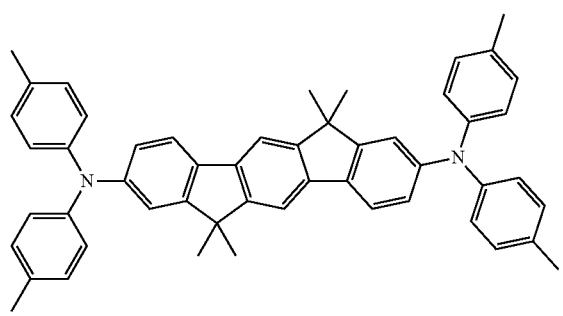

<Formula 12>

<Compound 4>

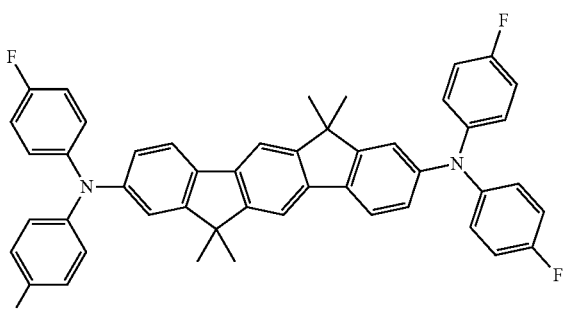

<Formula 13>

<Compound 5>

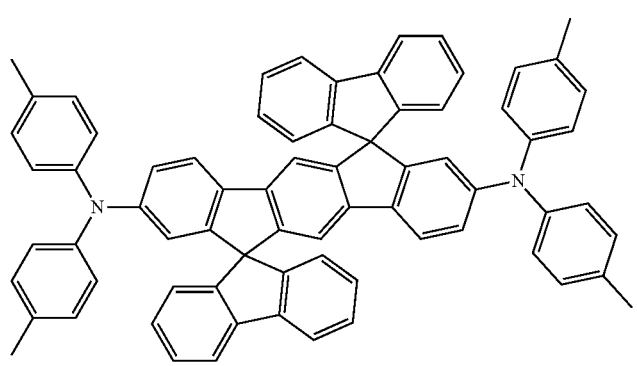

<Formula 14>

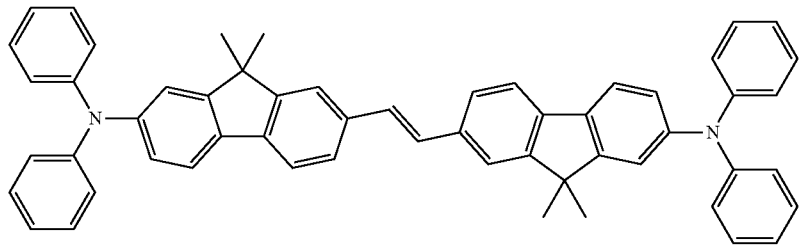

<Compound 6>

<Formula 15>

In regard to the mixed organic layer, the pyrazine derivative that is used as a dopant may be a hexaazatriphenylene derivative represented by Formula 16 below:

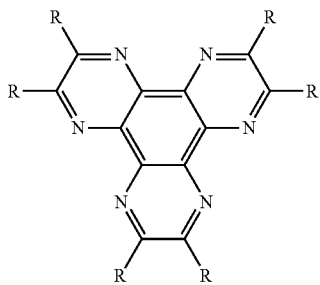

<Formula 16> wherein R is a hydrogen atom, a C1-C10 alkyl group, an alkyloxy group, dialkyl amine, halogen, or cyano.

For example, the pyrazine derivative may be hexaazatriphenylene hexacarboxylnitrile having the following structure:

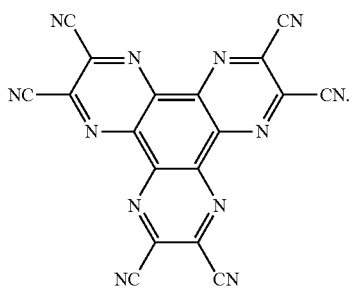

<Formula 17>

The amount of the pyrazine derivative may be in the range of about 0.1 to about 99.9 parts by weight, for example, about 0.1 to about 95 parts by weight, based on 100 parts by weight of the mixed organic layer.

The mixed organic layer including the fluorene derivative and the pyrazine derivative may have a thickness of about 1 to about 210 nm, for example, about 2 to about 75 nm.

The hole-related layer may further include at least one layer of a hole injection layer and a hole transport layer.

The hole injection layer may be formed by vacuum-thermal depositing or spin-coating a conventional hole injection layer forming material that is used in a conventional organic light-emitting device. However, according to another embodiment, the hole injection layer may not be used. Examples of the conventional hole injection layer forming material include, but are not limited to, a phthalocyanine compound, such as copper phthalocyanine; amine derivatives, such as 4,4',4''-tri(N-carbazolyl)triphenyl amine (TCTA), 4,4',4''-tris(3-methylphenylamino)triphenylamine (m-MTDATA), or 4,4,4''-tris(3-methylphenylamino) phenoxybenzene (m-MTDAPB); polyaniline/Dodecylbenzenesulfonic acid (Pani/DBSA); poly(3,4-ethylenedioxythiophene)/poly(4-styrenesulfonate) (PEDOT/PSS); polyaniline/camphor sulfonic acid (Pani/CSA); and (polyaniline)/poly(4-styrenesulfonate) (PANI/PSS).

The hole transport layer may be formed by vacuum-thermal depositing or spin-coating a conventional hole transport layer forming material on the hole transport layer or the mixed organic layer. Examples of the conventional hole transport layer forming material include, but are not limited to, triphenyl amine, tritolylamine, tolyldiphenylamine, N,N'-diphenyl-N,N'-(3-methylphenyl)-1,1-biphenyl-4,4'-diamine, N,N,N',N'-tetra(4-methylphenyl)-1,1'-phenyl-4,4'-diamine, N,N,N',N'-tetra(4-methylphenyl)-1,1'-biphenyl-4,4'-diamine, N,N'-diphenyl-N,N'-di(1-naphthyl)-1,1'-biphenyl-4,4'-diamine, N,N'-di(methylphenyl)-N,N'-di(4-n-butylphenyl)-phenanthrenel-9,10-diamine, 4,4',4''-tris(3-methylphenyl)-N-phenylamino)triphenyl amine, 1,1-bis(4-di-p-tolylaminophenyl)cyclohexane, a carbazole moiety-containing triaryl amine-based compound, and an oligomer or polymer.

Examples of the carbazole moiety-containing triaryl amine-based compound include, but are not limited to, 4,4'-bis(9-carbazolyl)-1,1'-biphenyl and 4,4'-bis(3-methyl-4,4', 4''-tris(3-methylphenylamino)triphenylamine(m-MTDATA), N,N'-bis(3-methylphenyl)-N,N'-diphenyl-[1,1-biphenyl]-4,4'diamine(TPD), and 4,4',4''-tri(N-carbazolyl) triphenyl amine(TCTA).

The thickness of the hole transport layer may be in the range of about 3 to about 180 nm.

An emission layer may be formed on the hole-related layer by using a blue, red or green light-emitting material, for example, a blue light-emitting material. Examples of the blue light-emitting material include pyrenes, perylenes, anthracenes, distyrylamine derivative, benzoxazoles, a quinolinolate-based metal complex, benzothiazoles, benzoimidazoles, chrysenes, phenanthrenes, distyrylbenzenes, distyrylarylenes, divinylarylenes, trisstyrylarylenes, triarylethylenes, tetraarylbutadienes, and iridium complex derivatives, for example, 4,4'-bis(2,2-diphenyl-ethene-1-yl)diphenyl, 4,4'-bis(2,2-diphenyl-ethene-1-yl)-4,4'-dimethylphenyl, and 4,4'-bis(2,2-diphenyl-ethene-1-yl)-4,4'-di-(t-butyl)phenyl. The blue light-emitting material (dopant) may be used together with a blue host material such as distyrylarylenes, stilbenes, carbazole derivatives, triarylamines, a quinolinolate-based metal complex such as aluminum bis(2-methyl-8-quinolinolate)(p-phenylphenolate), or 4,4'-bis(2,2-diarylvinyl)biphenyls. In addition, a phosphorescent material such as iridium (III) bis[4,6-difluorophenyl-pyridinate-N,C2']picolinate, or bis[4,6-difluorophenyl-pyridinate-N,C2']iridium (acetylacetonate) may also be used as the blue host material.

The emission layer may include an anthracene derivative, an amine-containing styryl derivative, or a mixture thereof.

The anthracene derivative may include, at its center, one anthracene moiety or two anthracene moieties that are directly connected to each other, and for example, may be any one of Compounds 7-15 represented by Formulae 18-26, but is not limited thereto:

<Compound 7>

<Formula 18>

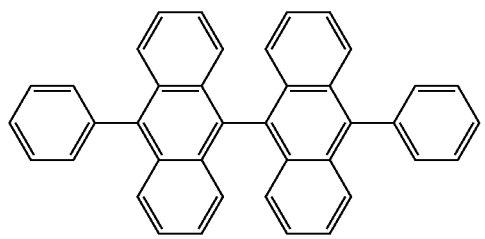

<Compound 8>

<Formula 19>

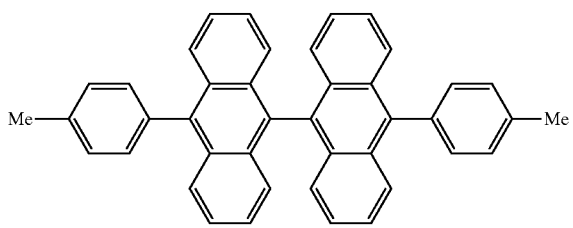

<Compound 9>

<Formula 20>

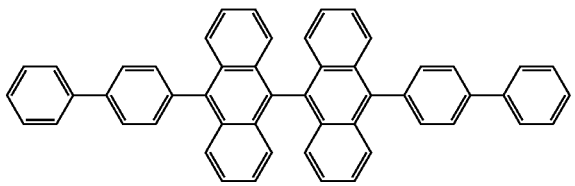

<Compound 10>

<Formula 21>

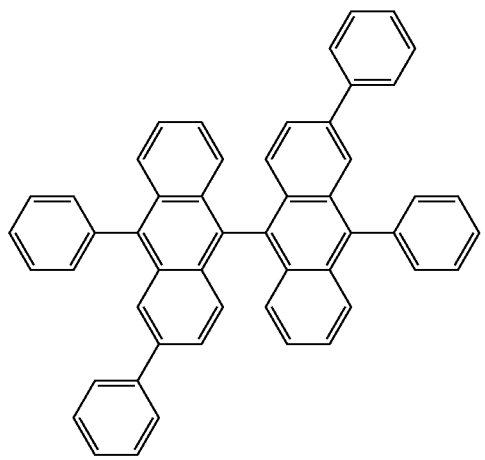

<Compound 11>

<Formula 22>

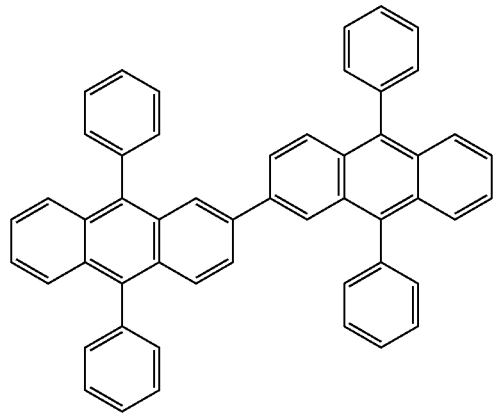

<Compound 12>

<Formula 23>

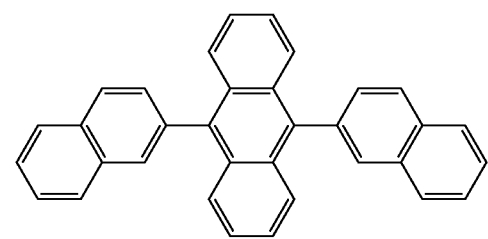

<Compound 13>

<Formula 24>

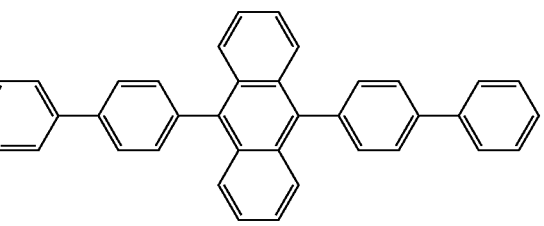

<Compound 14>

<Formula 25>

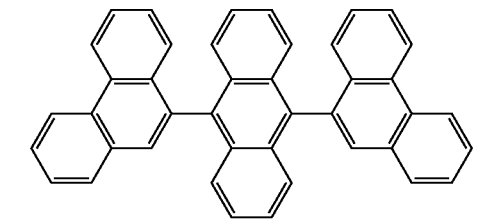

<Compound 15>

<Formula 26>

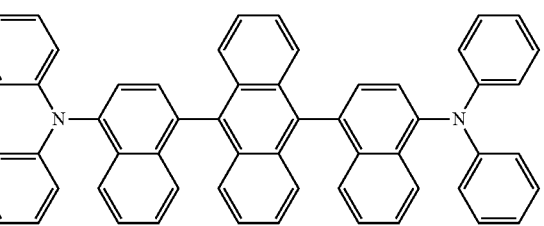

wherein Me represents a methyl group.

The amine-containing styryl derivative may be selected from the group consisting of an amine-containing mono styryl derivative, an amine-containing distyryl derivative, an amine-containing tristyryl derivative, and an amine-containing tetrastyryl derivative. For example, the amine-containing styryl derivative may be any one of Compounds 16-20 represented by Formulae 27-31, but is not limited thereto:

<Compound 16>

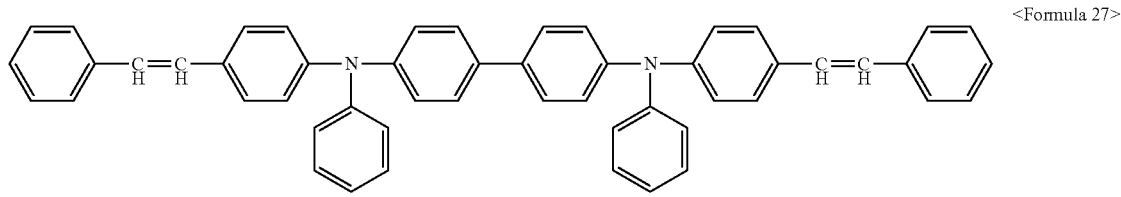

<Formula 27>

<Compound 17>

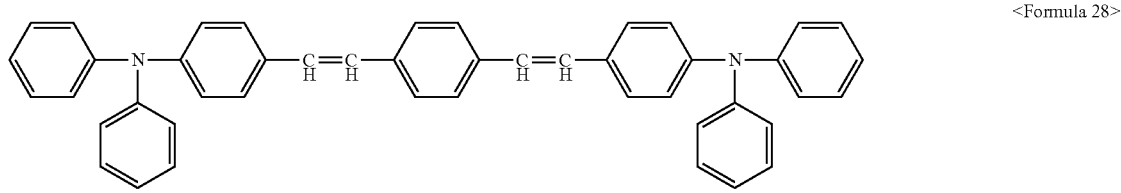

<Formula 28>

<Compound 18>

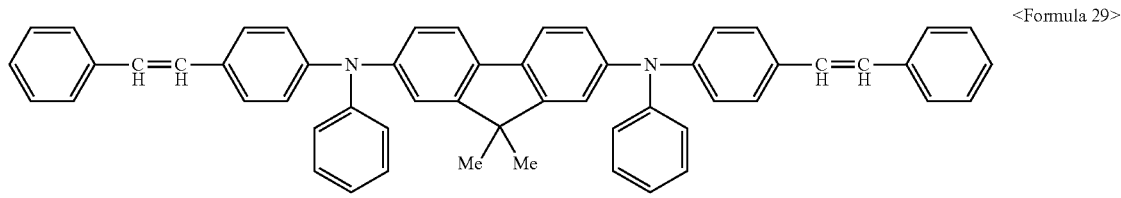

<Formula 29>

<Compound 19>

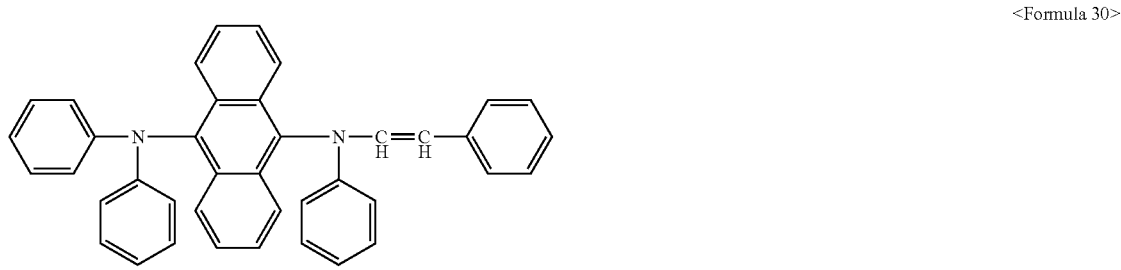

<Formula 30>

<Compound 20>

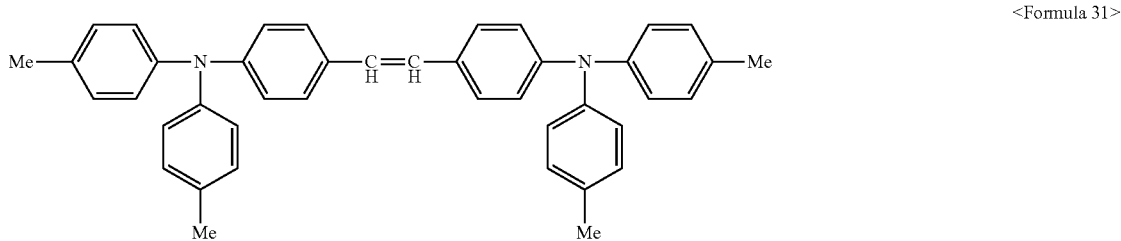

<Formula 31>

An organic light-emitting device according to an embodiment of the present invention may have a decreased operating voltage and an increased emission efficiency by using the hole-related layer including the mixed organic layer together with an electron transport layer including a lithium quinolate and a pyridine derivative.

The pyridine derivative may be a compound represented by Formula 32 below:

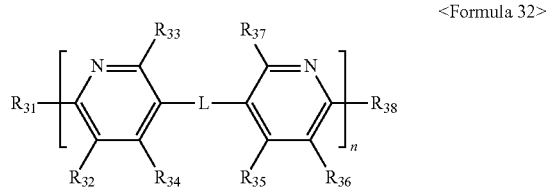

<Formula 32> wherein L may be a direct linkage or a bivalent linking group, and may be selected from the group consisting of methylene, vinylene, phenylene, anthrylene, thienylene, fluorenylene, spirobifluorenylene, indenofluorenylene, pyridylene, carbazolylene, indenocarbazolylene, benzothiazolylene, oxadiazolylene, pyrylene, furylene, and the above-described groups substituted with one or more substituents selected from the group consisting of alkyl, alkoxy, alkenyl, alkynyl, alkylthio, alkylamino, arylamino, heteroarylamino, aryloxy, heteroaryloxy, arylthio, heteroarylthio, halogen, and cyano, and $R_{31}$ to $R_{38}$ are, each independently, a group selected from groups having the following structures:

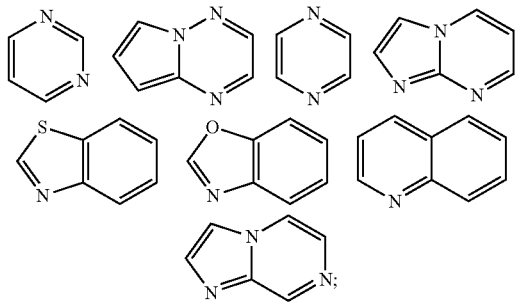

and n is an integer from 2 to 6.

The weight ratio of the pyridine derivative to the lithium quinolate may be 1:9 to 9:1, for example, 5:5. The thickness of the electron transport layer may be about 10 to about 100 nm.

An electron injection layer (EIL) may be formed by depositing a material that enables easy injection of electrons from an anode, on the electron transport layer.

The EIL may be formed of a well-known EIL material such as lithium quinolate, LiF, NaCl, CsF, $Li_2O$, or BaO. For example, the EIL may be formed of lithium quinolate or lithium fluoride. The thickness of the electron injection layer may be in the range of about 0.1 to about 10 nm.

Hereinafter, substituents described above with reference to the formulas used in the present specification will now be defined in detail.

Examples of the unsubstituted $C_1$-$C_{30}$ alkyl group include a methyl group, an ethyl group, a propyl group, an isobutyl group, a sec-butyl group, a pentyl group, an iso-amyl group, and a hexyl group. In the unsubstituted $C_1$-$C_{30}$ alkyl group, at least one hydrogen atom may be substituted with a halogen atom, a $C_1$-$C_{30}$ alkyl group, a $C_1$-$C_{30}$ alkoxy group, a lower alkylamino group, a hydroxyl group, a nitro group, a cyano group, an amino group, an amidino group, hydrazine, hydrazone, a carboxyl group, a sulfonic acid group, or a phosphoric acid group.

Examples of the unsubstituted $C_1$-$C_{30}$ alkenyl group include a vinyl group, an allyl group, a propenyl group, an isopropenyl group, a butenyl group, an isobutenyl group, a pentenyl group, and the like. In the unsubstituted $C_1$-$C_{30}$ alkynyl group, at least one hydrogen atom may be substituted with the substituents described above in conjunction with the unsubstituted $C_1$-$C_{30}$ alkyl group.

Examples of the $C_1$-$C_{30}$ alkoxy group include a methoxy group, an ethoxy group, a propoxy group, an isobutyloxy group, a sec-butyloxy group, a pentyloxy group, an isoamyloxy group, a hexyloxy group, and the like. For example, the $C_1$-$C_{30}$ aryloxy group may be a phenyloxy group or a naphthyloxy group. In the alkoxy and aryloxy group, at least one hydrogen atom may be substituted with the substituents described above in conjunction with the unsubstituted $C_1$-$C_{30}$ alkyl group.

The $C_6$-$C_{30}$ aryl group refers to a carbocyclic aromatic system including at least one ring. When the $C_6$-$C_{30}$ aryl group includes two or more rings, these rings may be attached to each other using a pendent method or may be fused together. The term 'aryl' refers to an aromatic system, such as phenyl, naphthyl, or tetrahydronaphthyl. In the aryl group, one or more hydrogen atoms may be substituted with the substituents as described above in conjunction with the unsubstituted $C_1$-$C_{30}$ alkyl group.

The $C_2$-$C_{30}$ heteroaryl group refers to a monovalent monocyclic ring compound including 2-30 ring atoms, wherein one, two, or three hetero atoms are selected from nitrogen (N), oxygen (O), P and sulfur (S), and the other ring atoms are carbons (C). When the $C_2$-$C_{30}$ heteroaryl group has two or more rings, these rings may be attached to each other using a pendent method or may be fused together. Examples of the hetero aryl group include, but not limited to, pyridyl, thienyl, furyl and benzothienyl. In the hetero aryl group, at least one hydrogen atom may be substituted with the substituents described above in conjunction with the $C_1$-$C_{30}$ alkyl group.

The mixed organic layer, the hole injection layer, the hole transport layer, the emission layer, the electron transport layer, and the electron injection layer may be formed by using various known methods such as a vacuum deposition method, a spin-coating method, a casting method, or the like.

The second electrode may be formed on the EIL by using a method such as a vacuum deposition method or a sputtering method. The material for forming the second electrode may include a metal, an alloy, or an electrically conductive compound, or a mixture thereof, which are materials that have a low work function. Examples of such a material include Li, Mg, Al, Al—Li, Ca, Mg—In, and Mg—Ag. For example, the second electrode may be formed of Mg—Ag.

According to an embodiment of the present invention, a combination of a pyrazine derivative-doped mixed organic layer and a hole transport layer including lithium quinolate and a pyridine derivative enables manufacture of an organic light-emitting device having substantially low power consumption. The organic light-emitting device according to the one or more embodiments of the present invention may be included in various types of flat panel display devices, such as passive matrix organic light-emitting display devices or active matrix organic light-emitting display devices.

One or more embodiments will now be described in more detail with reference to the following examples. However, these examples are for illustrative purposes only and are not intended to limit the scope of the one or more embodiments.

EXAMPLE

Example 1

To manufacture a first electrode, a Corning 15 Ω/cm² (1200 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting ITO glass substrate was mounted into a vacuum deposition device.

Compound 6 that is a fluorene derivative and hexaazatriphenylenehexacarboxylnitrile that is a pyrazine derivative were deposited in a weight ratio of 99:1 on the glass substrate in which the first electrode was patterned, thereby forming a mixed organic layer having a thickness of 50 nm.

4,4'-bis(3-methyl-9-carbazolyl)-1,1'-biphenyl was deposited on the mixed organic layer, thereby forming a hole transport layer having a thickness of 100 nm.

A host Compound 13 and a dopant Compound 17 were co-deposited in the weight ratio of 97:3 on the hole transport layer, thereby forming an emission layer having a thickness of 300 Å.

Then, Compound 21 represented by Formula 32, which is a pyridine derivative, and a lithium quinolate were co-deposited in a weight ratio of 5:5 on the emission layer, thereby forming an electron transport layer having a thickness of 300 Å. LiQ was deposited on the electron transport layer to form an electron injection layer having a thickness of 5 Å, and then an Mg—Ag electrode having a thickness of 160 Å was formed as a second electrode, thereby completing the manufacture of an organic light-emitting device.

<Compound 21>

Example 2

An organic light-emitting device was manufactured in the same manner as in Example 1, except that a mixed organic layer having a thickness of 50 nm was formed by co-depositing hexaazatriphenylene hexacarboxylnitrile and Compound 1, which is a fluorene derivative, in a weight ratio of 2:98.

Example 3

An organic light-emitting device was manufactured in the same manner as in Example 1, except that a mixed organic layer having a thickness of 50 nm was formed by co-depositing hexaazatriphenylenehexacarboxylnitrile and Compound 2 that is a fluorene derivative in a weight ratio of 3:97.

Example 4

An organic light-emitting device was manufactured in the same manner as in Example 1, except that a mixed organic layer having a thickness of 50 nm was formed by co-depositing hexaazatriphenylenehexacarboxylnitrile and Compound 4 that is a fluorene derivative in a weight ratio of 4:96.

Comparative Example 1

An organic light-emitting device was manufactured in the same manner as in Example 1, except that triphenyl amine was vacuum-deposited on the substrate in which the first electrode was patterned so as to form a hole transport layer having a thickness of 1400 Å, and a host MADN(2-methyl-9,10-di(2-naphthyl)anthracene) and a dopant distyrylamine were used in a weight ratio of 97:3.

Evaluation Example

The efficiency and operating voltage of the organic light-emitting devices manufactured according to Examples 1 to 4 and Comparative Example 1 were evaluated using a spectra colorimeter PR650 and 238 HIGH CURRENT SOURCE MEASURE UNIT produced by KEITHLEY. A voltage applied to the organic light-emitting devices was from DC 2.0 V to 5 V at intervals of 0.5 V, and each organic light-emitting device was evaluated eight or more times and the results are shown in Table 1.

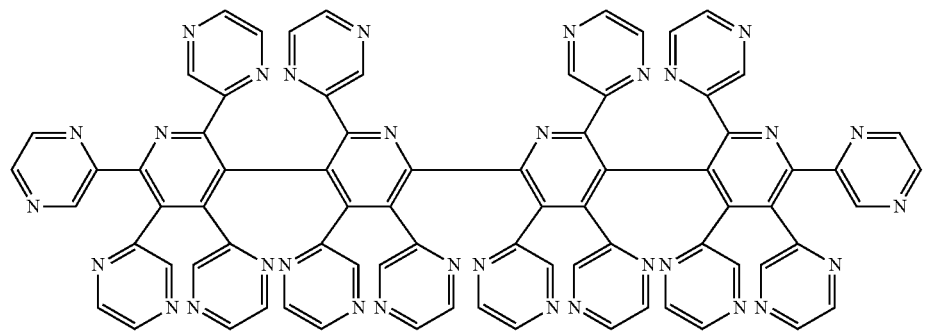

<Formula 33>

TABLE 1

|  | Operating voltage(V) | Emission efficiency(Cd/A) | (x, y) | Converted efficiency |
|---|---|---|---|---|
| Example 1 | 3.9 | 3.8 | (0.145, 0.044) | 84 |
| Example 2 | 3.9 | 4.2 | (0.144, 0.048) | 87 |
| Example 3 | 4.2 | 4.0 | (0.145, 0.047) | 84 |
| Example 4 | 4.2 | 4.9 | (0.144, 0.047) | 103 |
| Comparative Example 1 | 4.5 | 2.9 | (0.146, 0.043) | 67.4 |

Referring to Table 1, the organic light-emitting devices manufactured according to Examples 1 to 4 have higher emission efficiencies than the organic light-emitting device manufactured according to Comparative Example 1.

As described above, organic light-emitting devices according to the one or more of the above embodiments of the present invention have low operating voltages and high emission efficiencies.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An organic light-emitting device, comprising:
   a first electrode;
   a second electrode;
   an emission layer between the first electrode and the second electrode;
   a mixed organic layer between the emission layer and the first electrode, the mixed organic layer comprising: a fluorene derivative selected from Compound 5, Compound 6 and one of Formulas 2-9; and a pyrazine derivative represented by Formula 16:

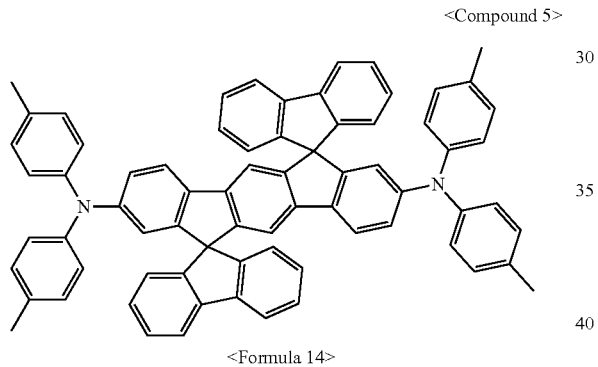
<Compound 5>

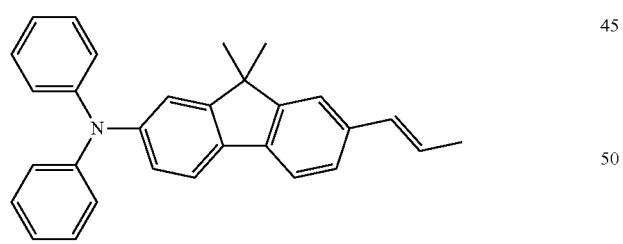
<Compound 6>

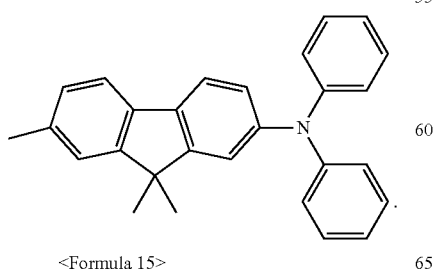
<Formula 15>

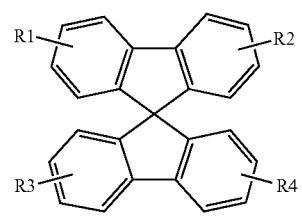
<Formula 2>

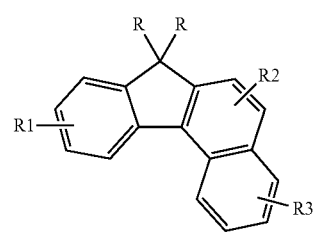
<Formula 3>

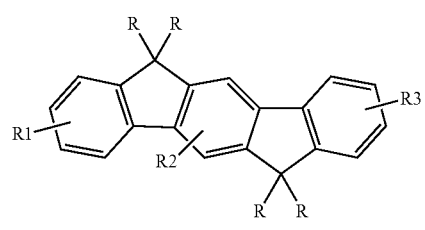
<Formula 4>

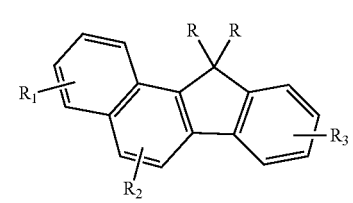
<Formula 5>

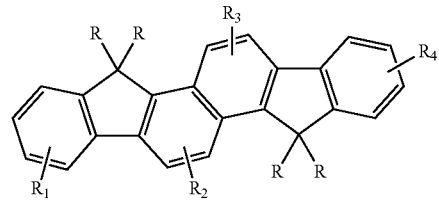
<Formula 6>

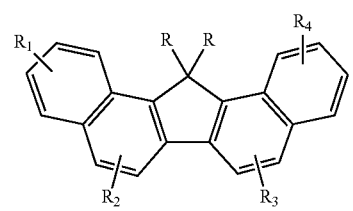
<Formula 7>

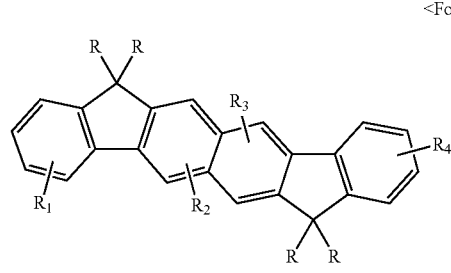
<Formula 8>

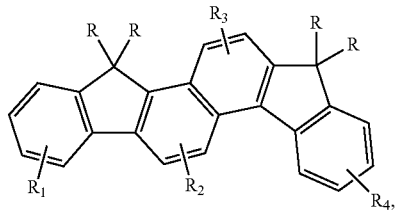

R, $R_1$, $R_2$, $R_3$ and $R_4$ in Formulas 1-9 being each independently one of a hydrogen atom, a substituted or unsubstituted $C_{1-30}$ alkyl group, a substituted or unsubstituted $C_{1-30}$ alkenyl group, a substituted or unsubstituted $C_{1-30}$ alkoxy group, a substituted or unsubstituted $C_{6-30}$ aryl group, a substituted or unsubstituted $C_{6-30}$ aryloxy group, a substituted or unsubstituted $C_{2-30}$ heteroaryl group, a substituted or unsubstituted $C_{5-30}$ condensed polycyclic group, a hydroxyl group, a cyano group and a substituted or unsubstituted amino group,

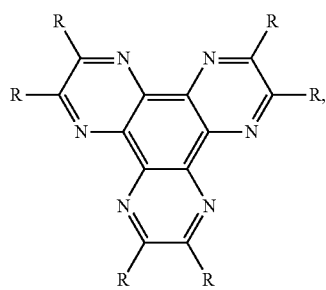

each R in Formula 16 being independently a hydrogen atom, a $C_1$-$C_{10}$ alkyl group, an alkyloxy group, dialkyl amine, halogen, or cyano; and an electron transport layer between the emission layer and the second electrode, the electron transport layer comprising a lithium quinolate and a pyridine derivative.

2. The organic light-emitting device of claim 1, the fluorene derivative being selected from the group consisting of Compounds 1 through 4 represented by Formulae 10 through 13, respectively:

<Compound 1>

<Formula 10>

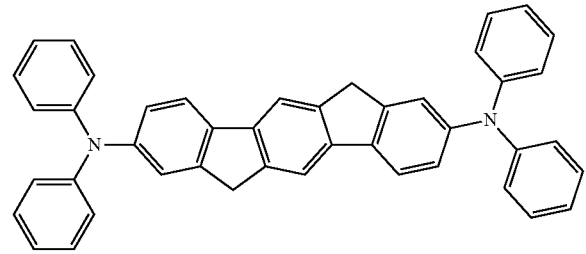

<Compound 2>

<Formula 11>

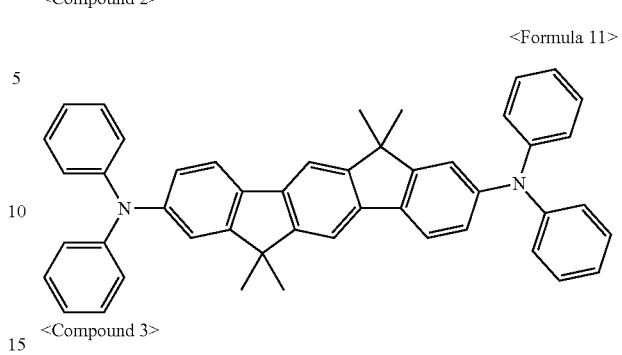

<Compound 3>

<Formula 12>

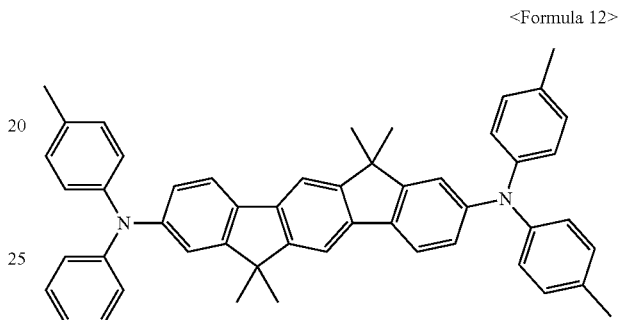

<Compound 4>

<Formula 13>

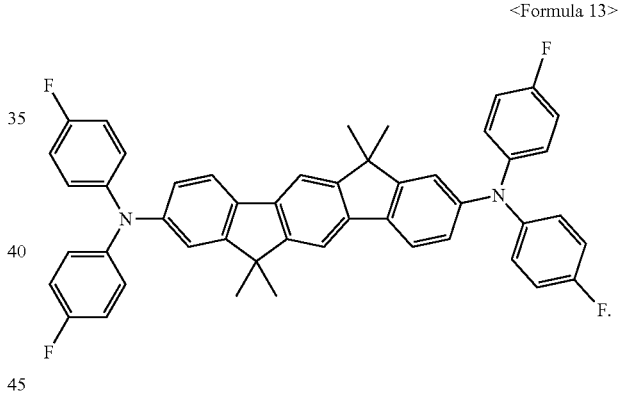

3. The organic light-emitting device of claim 1, the pyrazine derivative represented by Formula 16 comprising a compound represented by Formula 17:

<Formula 17>

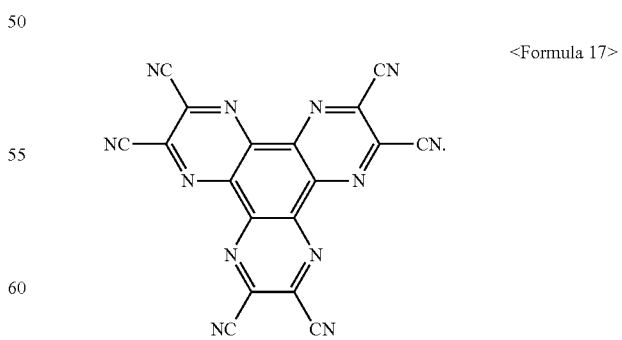

4. The organic light-emitting device of claim 1, the amount of the pyrazine derivative represented by Formula 16 being in the range of about 0.1 to about 99.9 parts by weight based on 100 parts by weight of the mixed organic layer.

5. The organic light-emitting device of claim 1, the thickness of the mixed organic layer being in the range of about 1 to about 210 nm.

6. The organic light-emitting device of claim 1, the pyridine derivative comprising a compound represented by Formula 32:

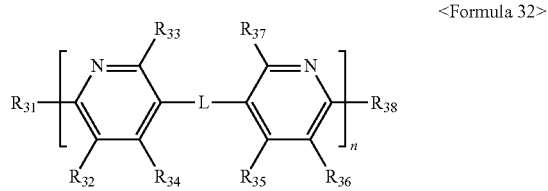

<Formula 32>

L being a direct linkage or a bivalent linking group, and being selected from the group consisting of methylene, vinylene, phenylene, anthrylene, thienylene, fluorenylene, spirobifluorenylene, indenofluorenylene, pyridylene, carbazolylene, indenocarbazolylene, benzothiazolylene, oxadiazolylene, pyrylene, furylene, and the above-described groups substituted with one or more substituents selected from the group consisting of alkyl, alkoxy, alkenyl, alkynyl, alkylthio, alkylamino, arylamino, heteroarylamino, aryloxy, heteroaryloxy, arylthio, heteroarylthio, halogen, and cyano, $R_{31}$ to $R_{38}$ are, each independently, a group selected from group consisting of the following structures:

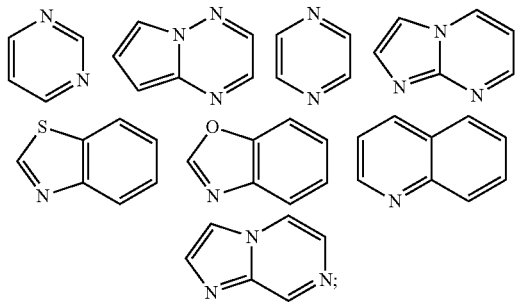

and n is an integer of 2 to 6.

7. The organic light-emitting device of claim 1, the pyridine derivative represented by Formula 32 comprising a compound represented by Formula 33:

8. The organic light-emitting device of claim 1, a weight ratio of the lithium quinolate to the pyridine derivative represented by Formula 32 being in the range of 1:9 to 9:1.

9. The organic light-emitting device of claim 1, further comprising a hole transport layer interposed between the mixed organic layer and the emission layer or between the first electrode and the mixed organic layer, and the hole transport layer comprises a carbazole moiety-containing triaryl amine derivative.

10. The organic light-emitting device of claim 9, the thickness of the hole transport layer being in a range of about 3 to about 180 nm.

11. The organic light-emitting device of claim 1, further comprising a hole injection layer between the mixed organic layer and the emission layer or between the first electrode and the mixed organic layer, and the hole injection layer comprises a compound selected from the group consisting of a phthalocyanine compound, an amine derivative, poly(3,4-ethylenedioxythiophene)/poly(4-styrenesulfonate) (PEDOT/PSS), polyaniline/camphor sulfonic acid (Pani/CSA), and (polyaniline)/poly(4-styrenesulfonate) (PANI/PSS).

12. The organic light-emitting device of claim 1, further comprising a hole injection layer between the first electrode and the emission layer and a hole transport layer between the hole injection layer and the emission layer, the mixed organic layer being positioned between the first electrode and the hole injection layer, between the hole transport layer and the emission layer, or formed inside the hole transport layer.

13. The organic light-emitting device of claim 1, the emission layer comprising one of an anthracene-based compound and a styryl-based compound.

14. The organic light-emitting device of claim 1, further comprising an electron injection layer comprising lithium quinolate or lithium fluoride between the electron transport layer and the second electrode.

15. An organic light-emitting device, comprising:
a first electrode;
a second electrode;
an emission layer between the first electrode and the second electrode;
a mixed organic layer between the emission layer and the second electrode, the mixed organic layer comprising a fluorene derivative and a pyrazine derivative, the fluorene derivative selected from compounds represented by Formulas 2 to 9 and the pyrazine derivative represented by Formula 16:

<Formula 33>

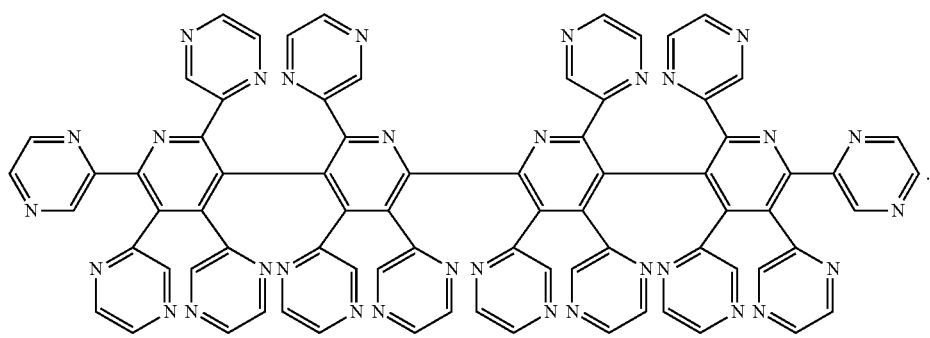

<Formula 2>
<Formula 3>
<Formula 4>
<Formula 5>
<Formula 6>
<Formula 7>
<Formula 8>

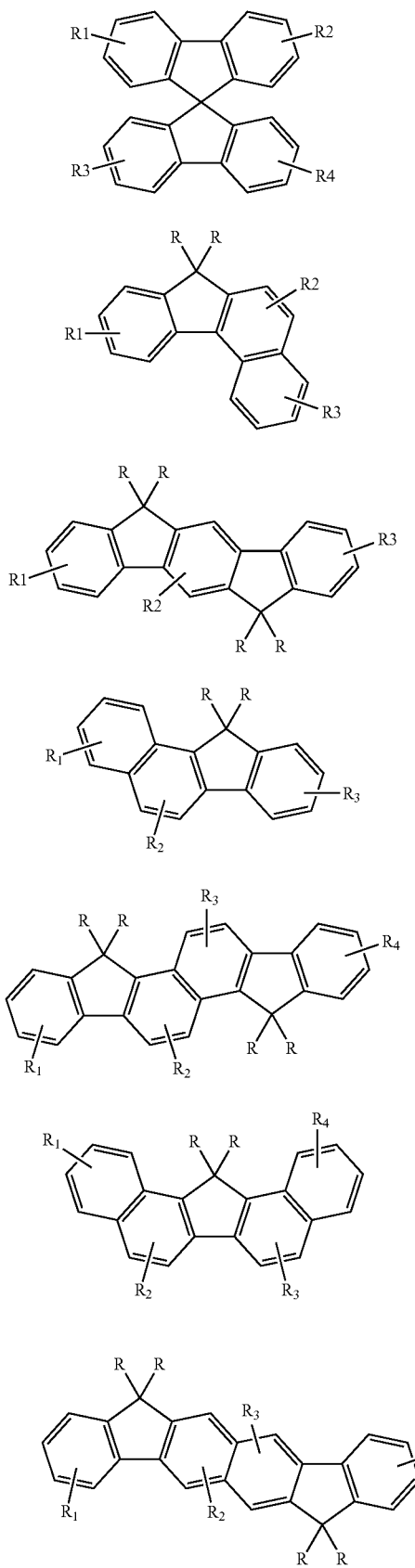

<Formula 9>

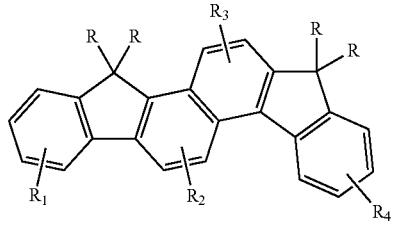

R, $R_1$, $R_2$, $R_3$ and $R_4$ in Formulae 2 through 9 being each independently selected from a hydrogen atom, a substituted or unsubstituted C1-30 alkyl group, a substituted or unsubstituted C1-30 alkenyl group, a substituted or unsubstituted C1-C30 alkoxy group, a substituted or unsubstituted C6-C30 aryl group, a substituted or unsubstituted C6-C30 aryloxy group, a substituted or unsubstituted C2-C30 heteroaryl, or a substituted or unsubstituted C5-C30 condensed polycyclic group, a hydroxyl group, a cyano group, and a substituted or unsubstituted amino group; and <Formula 16>

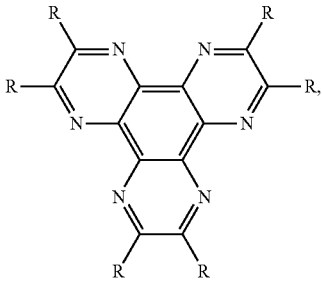

each R in Formula 16 being independently a hydrogen atom, a C1-C10 alkyl group, an alkyloxy group, dialkyl amine, halogen, or cyano; and an electron transport layer between the emission layer and the second electrode, the electron transport layer comprising a lithium quinolate and a pyridine derivative represented by Formula 32:

<Formula 32>

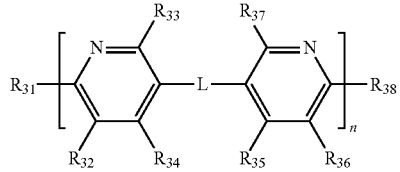

L being a direct linkage or a bivalent linking group, and being selected from the group consisting of methylene, vinylene, phenylene, anthrylene, thienylene, fluorenylene, spirobifluorenylene, indenofluorenylene, pyridylene, carbazolylene, indenocarbazolylene, benzothiazolylene, oxadiazolylene, pyrylene, furylene, and the above-described groups substituted with one or more substituents selected from the group consisting of alkyl, alkoxy, alkenyl, alkynyl, alkylthio, alkylamino, arylamino, heteroarylamino, aryloxy, heteroaryloxy, arylthio, heteroarylthio, halogen, and cyano, $R_{31}$ to $R_{38}$ are, each independently, a group selected from group consisting of the following structures:

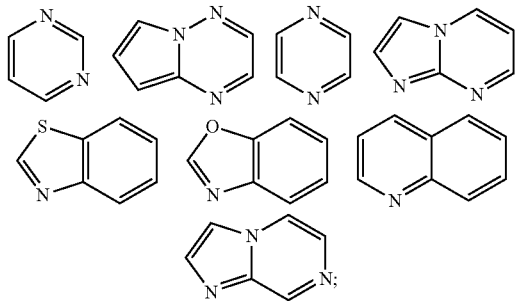

and n is an integer of 2 to 6.

16. An organic light-emitting device, comprising:

a first electrode;

a second electrode;

an emission layer between the first electrode and the second electrode;

a hole-related layer comprising a hole injection layer between the first electrode and the emission layer, a hole transport layer between the hole injection layer and the emission layer, and a mixed organic layer positioned between the first electrode and the hole injection layer, between the hole transport layer and the emission layer, or inside the hole transport layer, the mixed organic layer comprising a fluorene derivative and a pyrazine derivative, the fluorene derivative selected from compounds represented by Formulas 2 to 9 and the pyrazine derivative represented by Formula 16:

<Formula 2>

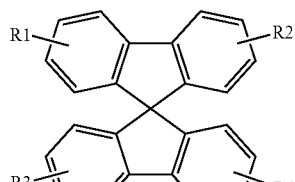

<Formula 3>

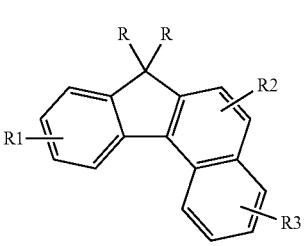

<Formula 4>

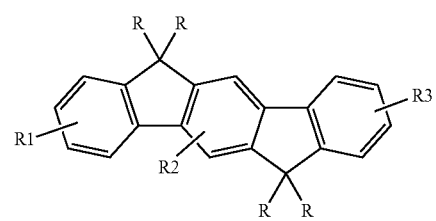

<Formula 5>

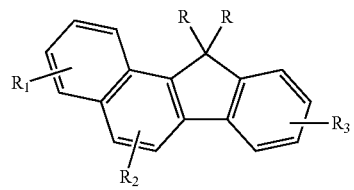

<Formula 6>

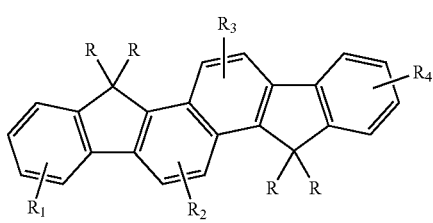

<Formula 7>

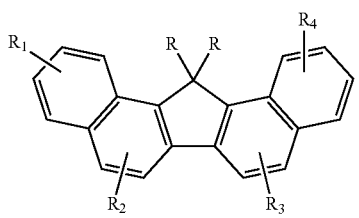

<Formula 8>

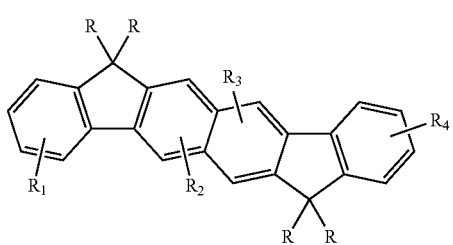

<Formula 9>

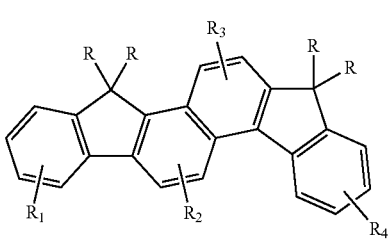

R, $R_1$, $R_2$, $R_3$ and $R_4$ in Formulae 2 through 9 being each independently selected from a hydrogen atom, a substituted or unsubstituted C1-30 alkyl group, a substituted or unsubstituted C1-30 alkenyl group, a substituted or unsubstituted C1-C30 alkoxy group, a substituted or unsubstituted C6-C30 aryl group, a substituted or unsubstituted C6-C30 aryloxy group, a substituted or unsubstituted C2-C30 heteroaryl, or a substituted or unsubstituted C5-C30 condensed polycyclic group, a hydroxyl group, a cyano group, and a substituted or unsubstituted amino group; and

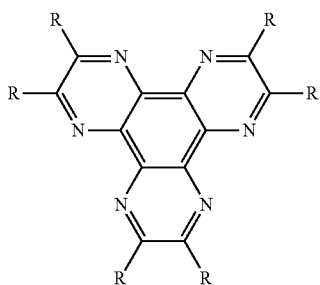

<Formula 16> each R in Formula 16 being independently a hydrogen atom, a C1-C10 alkyl group, an alkyloxy group, dialkyl amine, halogen, or cyano; and an electron transport layer between the emission layer and the second electrode, the electron transport layer comprising a lithium quinolate and a pyridine derivative represented by Formula 32:

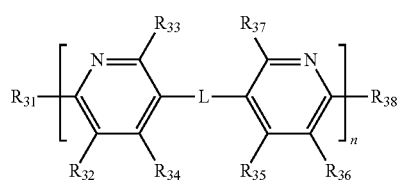

<Formula 32>

L being one of a direct linkage and a bivalent linking group, and being selected from the group consisting of methylene, vinylene, phenylene, anthrylene, thienylene, fluorenylene, spirobifluorenylene, indenofluorenylene, pyridylene, carbazolylene, indenocarbazolylene, benzothiazolylene, oxadiazolylene, pyrylene, furylene, and the above-described groups substituted with one or more substituents selected from the group consisting of alkyl, alkoxy, alkenyl, alkynyl, alkylthio, alkylamino, arylamino, heteroarylamino, aryloxy, heteroaryloxy, arylthio, heteroarylthio, halogen, and cyano, $R_{31}$ to $R_{38}$ are, each independently, a group selected from group consisting of the following structures:

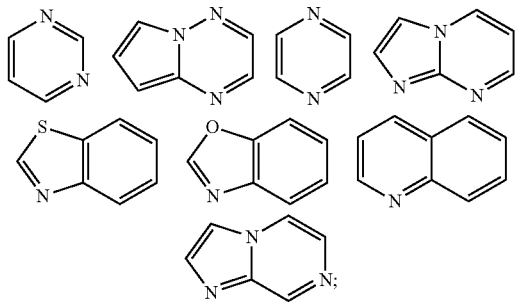

and n is an integer of 2 to 6.

17. The organic light-emitting device of claim 16, further comprising an electron injection layer comprising lithium quinolate or lithium fluoride between the electron transport layer and the second electrode.

18. An organic light-emitting device, comprising:
a first electrode;
a second electrode;
an emission layer between the first electrode and the second electrode;
a mixed organic layer between the emission layer and the first electrode, the mixed organic layer comprising Compound 6 and a compound represented by Formula 17; and
an electron transport layer between the emission layer and the second electrode, the electron transport layer comprising a lithium quinolate and Compound 21:

<Compound 6>

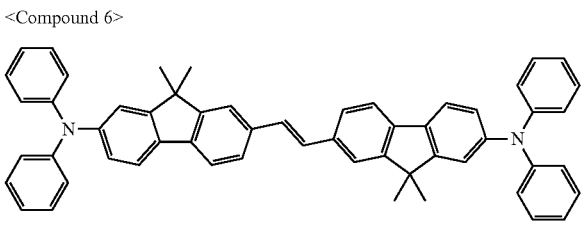

<Formula 17>

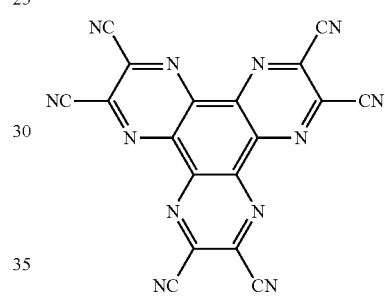

<Compound 21>

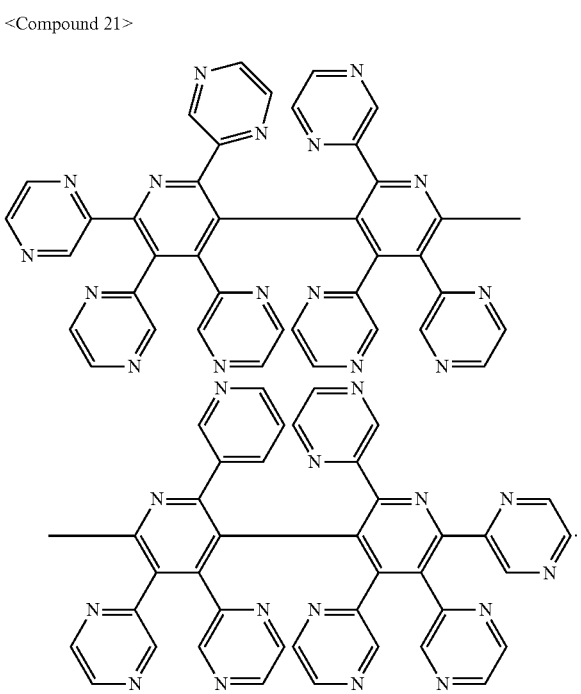

19. The organic light-emitting device of claim 1, the fluorene derivative being described by Formula 4 below:

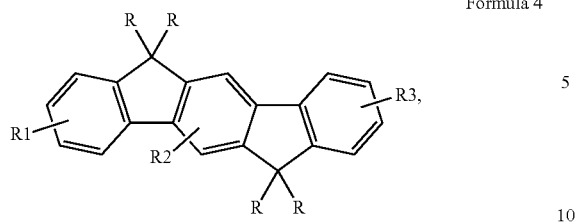

Formula 4

R, $R_1$, $R_2$ and $R_3$ being each independently one of a hydrogen atom, a substituted or unsubstituted C1-C30 alkyl group, a substituted or unsubstituted C1-C30 alkenyl group, a substituted or unsubstituted $C_1$-$C_{30}$ alkoxy group, a substituted or unsubstituted $C_6$-$C_{30}$ aryl group, a substituted or unsubstituted $C_6$-$C_{30}$ aryloxy group, a substituted or unsubstituted $C_2$-$C_{30}$ heteroaryl, or a substituted or unsubstituted $C_5$-$C_{30}$ condensed polycyclic group, a hydroxyl group, a cyano group and a substituted or unsubstituted amino group.

* * * * *